United States Patent
Sanderford, Jr. et al.

(10) Patent No.: US 6,335,953 B1
(45) Date of Patent: *Jan. 1, 2002

(54) ENHANCED FREQUENCY AGILE RADIO

(75) Inventors: H. Britton Sanderford, Jr., New Orleans; Robert J. Davis, Metairie; Robert E. Rouquette, Kenner, all of LA (US)

(73) Assignee: Axonn, L.L.C., New Orleans, LA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/432,258

(22) Filed: Nov. 2, 1999

Related U.S. Application Data

(60) Continuation of application No. 08/931,416, filed on Sep. 16, 1997, now Pat. No. 6,031,885, which is a continuation of application No. 08/311,774, filed on Sep. 23, 1994, now Pat. No. 5,668,828, which is a continuation-in-part of application No. 08/103,993, filed on Aug. 10, 1993, now Pat. No. 5,377,222, which is a division of application No. 07/880,268, filed on May 8, 1992, now Pat. No. 5,311,541.

(51) Int. Cl.$^7$ .......................... H04L 27/05; H04B 17/00; H04B 1/00

(52) U.S. Cl. .......................... 375/344; 455/67.4; 455/71

(58) Field of Search .......................... 375/344, 130; 455/67.4, 71, 260, 264, 161.1, 255–257, 192.1, 192.2, 226.1

(56) References Cited

U.S. PATENT DOCUMENTS

| | | | | |
|---|---|---|---|---|
| 5,115,515 A | * | 5/1992 | Yamamoto et al. | 455/71 |
| 5,493,710 A | * | 2/1996 | Takahara et al. | 455/192.2 |
| 6,081,700 A | * | 6/2000 | Salvi et al. | 455/193.3 |
| 6,108,525 A | * | 8/2000 | Takemura | 455/67.4 |

* cited by examiner

Primary Examiner—Chi Pham
Assistant Examiner—Khai Tran
(74) Attorney, Agent, or Firm—Oblon, Spivak, McClelland, Maier & Neustadt, P.C.

(57) ABSTRACT

A method utilizing intentionally generated in-band frequency harmonics to compensate for frequency error and frequency drift in a voltage controlled oscillator of a receiver, thereby eliminating the frequency synthesizer and RF divider required in conventional designs. The method includes modulating the intentionally generated frequency in a predetermined manner so that a receiver can identify the intentionally generated frequency and includes the use of plural frequency harmonics for use in a curve fitting technique to correct frequency error in the voltage controlled oscillator.

10 Claims, 8 Drawing Sheets

SYSTEM CONFIGURATION

RECEIVER

SHUNT TABLE

FREQUENCY SCAN ALGORITHM

ENHANCED FREQUENCY AGILE RADIO

CROSS REFERENCE TO RELATED APPLICATIONS

This is a continuation of application Ser. No. 08/931,416, filed Sep. 16, 1997, now issued as U.S. Pat. No 6,031,885, which is a continuation of application Ser. No. 08/311,774, filed Sep. 23, 1994, now issued as U.S. Pat. No. 5,668,828, which is a continuation-in-part application of application Ser. No. 08/103,993, filed Aug. 10, 1993, now issued as U.S. Pat. No. 5,377,222, which is a division of application Ser. No. 07/880,268 filed May 8, 1992, now issued as U.S. Pat. No. 5,311,541. The benefit of the earlier filing date of the parent patent application is claimed pursuant to 35 U.S.C. §120.

BACKGROUND OF THE INVENTION

This invention relates to robust methods of frequency re-use and frequency sharing which prevent independent radio systems from co-interference due to frequency crowding of available radio bands, and, more particularly, this invention relates to a method of frequency agility which can provide a low cost solution to many burst mode and continuous data communications applications, including security systems, fire systems, access control, energy management, remote control of model planes, remote process control, traffic light control, remote power meter reading, voice communication, radio location, or local area networks.

DESCRIPTION OF THE RELEVANT ART

The use of spread spectrum communications and techniques for diverse commercial and civilian applications has increased in recent years. By utilizing such techniques to minimize mutual interference and to provide anti-jamming advantages to multiple-access communications, as well as aiding in extremely accurate position location using satellites in synchronous and asynchronous orbits, spread spectrum techniques are known to offer the advantage of improved reliability of transmission in frequency-selective fading and multipath environments.

U.S. Pat. No. 4,799,062 to Sanderford, Jr. et al teaches that multipath in urban areas poses a problem for accurate position location, which may be overcome by using a method of synchronization of transmissions and unique identification codes to derive relative ranging times for determining position. Compensation for multipath may include spread spectrum techniques.

U.S. Pat. No. 4,977,577 to Arthur et al has a wireless alarm system using spread spectrum transmitters and fast frequency shift keying for achieving a coarse lock and a fine lock to the spread spectrum signal. By using spread spectrum techniques, such wireless alarm systems are highly reliable and provide a safety margin against jamming and undesirable interference. Other applications of spread spectrum techniques to commercial uses promise similar advantages in reliability in communications.

Methods for the serial search and acquisition of utilized spread spectrum frequencies are well known in the prior art, as shown in M. K. Simon et al., *Spread Spectrum Communications*, vol. 3, pp. 208–279, Rockville, Md.: Computer Science Press, 1985. In addition, M. K. Simon et al., supra at pp. 346–407 teach spread spectrum multiple access techniques such as utilizing ALOHA random access schemes.

OBJECTS OF THE INVENTION

A general object of the invention is to achieve superior jamming resistance compared to other spread spectrum means.

Another object of the invention is to allow multiple systems to co-exist without undesirable co-interference.

Another object of the invention is to minimize the effects of data collisions when a system supports numerous non-synchronized ALOHA protocol transmitters.

An additional object of the invention is to operate within the radio band allowed by the FCC with minimal cost and minimal frequency setting components.

A further object of the invention is to provide techniques suitable for a high level of monolithic circuit integration.

SUMMARY OF THE INVENTION

According to the present invention, as embodied and broadly described herein, a frequency agile method is provided which has a low cost solution to many burst mode and continuous data communications applications, including security systems, fire systems, access control, energy management, remote control of model planes, remote process control, traffic light control, remote power meter reading, voice communication, radio location, or other local area networks.

In remote monitoring applications, the frequency agile radio system typically includes one or more centrally located data collection receivers with one or more remotely located transmitters. In control applications, one or more centrally located transmitters may communicate with a plurality of remotely located receivers. Further, the system can provide two-way polled type communications where each data node requires both a receiver and a transmitter.

The method for providing frequency agility includes using a frequency agile transmitter and a frequency-agile radio system for sending a message-data signal by selecting a single pseudo-random frequency on which to transmit, by generating a preamble signal on a single carrier frequency for modulating message-data, by transmitting the preamble signal for a pre-set preamble time for allowing an appropriate frequency-agile receiver to lock-on the preamble signal, and by modulating the preamble signal with the message-data signal to produce a modulated signal. The message-data signal is defined herein to be a signal having message-data.

In addition, the method for providing frequency agility includes using a frequency-agile receiver in the frequency-agile radio system for avoiding occupied radio-frequency channels in a radio spectrum by scanning the radio spectrum, identifying occupied portions of the radio spectrum, updating information identifying the occupied portions, storing the updated information in memory means, associating a time-out period with the stored occupied portions, and skipping over the occupied portions of the radio spectrum during the time-out period in response to the information and while receiving with the frequency-agile receiver, so that only a single time counter is required for all radio bands.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
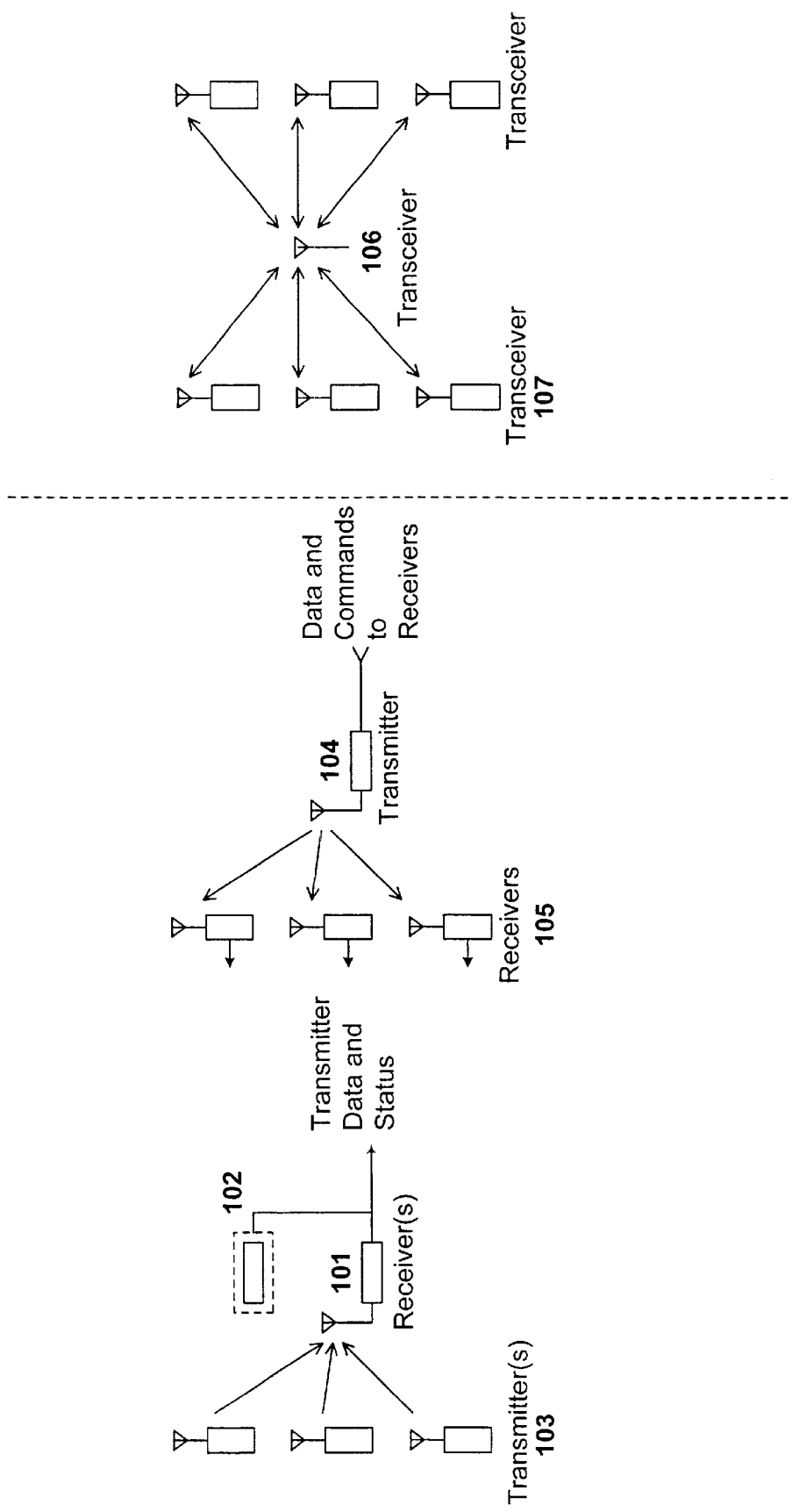
FIG. 1 shows a configuration for a frequency agile transmitter/receiver system.

Reference will now be made in detail to the present preferred embodiments of the invention, examples of which are illustrated in the accompanying drawings, wherein like reference numerals indicate like elements throughout the several views.

In the exemplary arrangement shown in FIG. 1, the frequency-agile transmitter is designed to send one full message-data signal on one single carrier frequency, with the carrier frequency pseudo-randomly selected.

To avoid loss of data throughput, in case the selected frequency is jammed, the frequency-agile transmitter, after delaying for a pseudo-random time interval, selects a new pseudo-random frequency as a next frequency, which is widely separated from the previous frequency, and re-transmits the entire message-data signal on that frequency. The number of redundant re-transmissions and a preselected average time interval between re-transmissions is programmable, which allows optimization to a particular installation. For example, if the number of transmissions required to overcome other sources of data loss, such as ALOHA collisions, bit error rate, impulse noise, etc., were 5, then by doubling the redundant transmissions to 10 would allow continued system operation if as much as ½ of the available radio band were jammed.

That is an extreme example, but consider in that example the time overhead, two to one, compared to the bandwidth overhead, ten to one or 200 to one, required by conventional spread spectrum techniques which use all of available radio spectrum simultaneously. The present invention is much more frequency efficient for equivalent anti-jam performance. Further, the extra time required to re-transmit with even 100% redundancy can be overcome by doubling the data rate which causes only a 3 dB penalty in receiver sensitivity.

The compensating advantage is large for anti-jamming and frequency re-use. For example, consider two adjacent but independent frequency-agile radio systems, a first system A and a second system B, each with single frequency-agile receiver and multiple transmitters. In a direct sequence system or a fast frequency hopper, each bit of a message-data signal is represented on every available frequency. For example, if a transmitter of the first system A were ON, and were set to use 63 frequencies, then the data messages signals received by the second system B are subjected to the multiple access suppression available, which is 18 dB or less. The frequency-agile radio system of the present invention responds differently. If a transmitter of the first system A were ON, and were set to use 63 hopping channels, then a data message signal received by the second system B intended for second system B's own transmitter(s) has only a 1 in 63 temporal chance for being interfered. Since the receiver is actually occupying only one frequency at a time, a very small increase to data message signal re-transmissions overcomes the 1 in 63 failure rate due to collisions from the first system A.

An additional method is used to enhance resistance to wide bandwidth jamming and to selective radio channel fading. A hop list or hop algorithm is designed to provide a minimum hop distance of 500 kHz or more per frequency step, so that, if the coherence bandwidth of the radio channel is 2 MHz, then several steps overcome the fade.

Each data transmission is proceeded by a pre-determined carrier preamble signal with a pre-set preamble period which provides the time needed by the receiver to sweep the entire radio spectrum available for the system to use and to lock-on the preamble signal. Such a sweep can take from one to three milliseconds, depending on system parameters. Additionally, the preamble signal can be modulated with a repetitive data code, called a PREAMBLE SYSTEM CODE, that identifies the transmitter as belonging to a particular system, so that, if an associated receiver locks on an energy source as the receiver sweeps, the receiver can rapidly demodulate the PREAMBLE SYSTEM CODE to determine if the energy source or data packet were intended for that receiver. If not, the receiver can continue to sweep its available spectrum to search for valid incoming messages. The goal is to minimize the dwell time on any piece of impulse noise, jammer, or data packets which are intended for an unrelated system receiver.

Prior to system operation the frequency-agile receiver performs a sweep of the radio spectrum available for system operation. The receiver logs all channels with higher than expected received energy levels. Either signal strength or a quieting detector or a phased-locked-loop "lock detect" circuit or the like is capable of supplying that information. Each usable frequency channel is associated with its own unique position in a memory device. The status of that channel is also associated with that memory location. The status information includes: 1) if the channel is "clear" or "jammed"; and 2) how many time counts must elapse prior to re-sampling to determine if that channel has become "clear". The jammed/clear indication can also be equipped with an additional associated counter such that more than one occurrence of channel jamming is required to set the JAMMED flag. That feature makes the system more robust against impulse noise. Further, the receiver does not consider a PREAMBLE SYSTEM CODE of an unrelated system to be JAMMING. Such occasional receptions are expected and quickly discarded prior to message "data" demodulation. Sufficient extra time is built into the preamble signal to allow for several collisions with unrelated PREAMBLE SYSTEM CODES, and for successful decode of a data message signal.

Upon initial set-up, the receiver determines the frequencies to avoid and a table containing information of such frequencies is stored in the receiver's memory. The table is then transferred via electrical means to the other associated transmitters or transceivers. The receiver can determine which PREAMBLE SYSTEM CODES are unused and available during power-up and initialization. The receiver can transfer the information on unused and available PREAMBLE SYSTEM CODES as a list of frequencies on which to transmit to other system transmitters as well. Such information transference can be magnetic, electrical, optical, acoustic, or via a display and entered through a keypad connected to the transmitter. Once the list is so loaded, the transmitter will not transmit on the frequencies marked as 'jammed' and will use only the PREAMBLE SYSTEM CODE assigned.

The PREAMBLE SYSTEM CODE can be data modulated via any appropriate means including frequency-shift-keying (FSK), binary-phase-shift-keying (BPSK), or amplitude-shift-keying (ASK) modulation. ASK modulation is less desirable, however, because ASK modulation requires time spent without full carrier presence.

One separate method to accomplish co-existence with adjacent systems requires that both the frequency-agile transmitter and the frequency-agile receiver be highly frequency stable. Such stability must be greater than the sum of transmitter and receiver frequency uncertainty, frequency drift, and data bandwidth. For example, the frequency-agile transmitter can transmit on any one of 50 frequencies, each separated by 500 kHz. If the required data bandwidth were 25 kHz, then 10–20 separate channels could fit in each 500 kHz hop slot. Therefore, 10–20 co-located systems could co-exist with no co-interference, and TDMA would not be needed. To attain frequency stabilization, the frequency-agile transmitter and frequency-agile receiver would simply offset their normal hop by a pre-determined number of 25 kHz slots. Each system could determine which slot is unused and then assign each unused slot to all associated system elements. This method of transmitting on any one of 50 frequencies does not work, however, if the accuracy or drift of the carrier frequency were greater than +13.5 kHz. At 915 MHz, the drift equals 15 ppm. Absent such accuracy, adjacent channels may cause interference. Therefore, the offsetting of the carrier frequency of each frequency-agile transmitter by at least the required data bandwidth plus compensation for frequency inaccuracies allows multiple systems to co-exist, which utilize this technique.

Previous attempts in the prior art to integrate voltage-controlled-oscillator (VCO) components with divider and phase comparison analog and digital circuits have failed, since the phase noise generated by the digital divider was induced into the VCO and phase comparator, but such phase noise ultimately reduces the sensitivity of the receiver. The preferred embodiment runs the digital divider for a brief period prior to transmission. The divided down signal is then used to produce a constant frequency error offset term to the VCO. The digital divider is then disabled after the frequency error offset is measured so that the VCO can run open-loop without being subjected to phase noise of the divider harmonics. The receiver is able to compensate for any short term frequency drift during transmission.

FIG. 1 depicts a frequency-agile receiver 101 which can be used to accept transmissions from a plurality of frequency-agile transmitters 103. The frequency-agile transmitters are non-synchronized and must depend on ALOHA type communicating redundancy to ensure data receptions. Additional optional frequency-agile receivers 102 may be included to expand system coverage or add spacial diversity to reduce fading.

FIG. 1 depicts a frequency-agile transmitter 104 sending message-data signals or command signals to a plurality of frequency-agile receivers 105. Each frequency-agile receiver is equipped with a unique address by which to accept commands and data intended for that unit. Once again, transmitter data redundancy is required to ensure reliability.

FIG. 1 depicts a system whereby a frequency-agile transceiver 106 may be linked to a single remote transceiver or by a plurality of remote transceivers 107. In such a system, each system element is associated with a unique address or identification number.

Any number of appropriate two way communications protocols may be utilized on such a system including poll-response, reservation request, report by exception, etc.

Figures 2A, 2B:
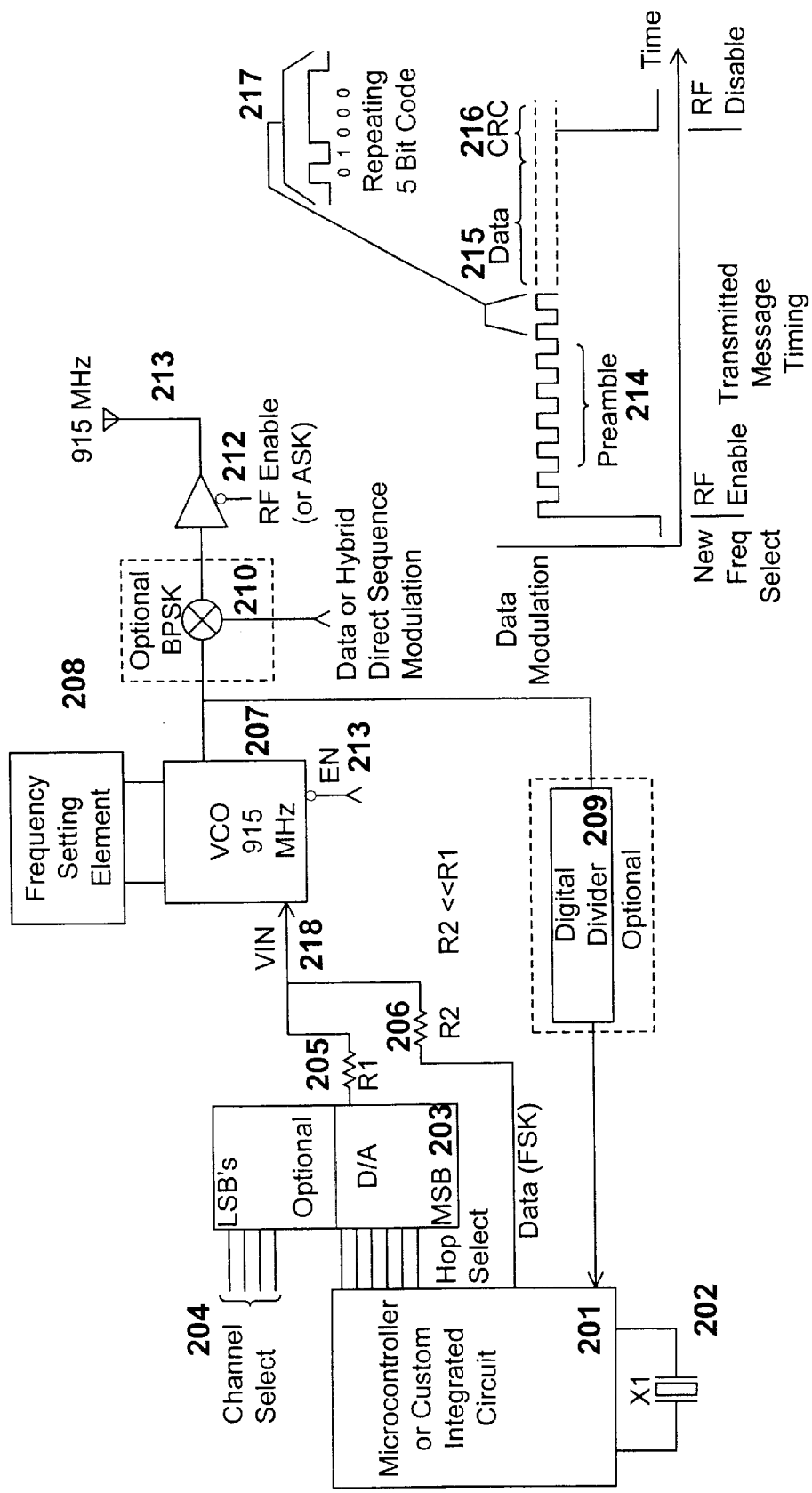
FIGS. 2A and 2B are a block diagram of a frequency agile transmitter.

As illustratively shown in FIGS. 2A and 2B, processor means, which may be embodied as a microprocessor or custom digital integrated circuit, is used to generate all transmitter timing. In order to initiate a transmission, the microprocessor 201 first selects the pseudo-random frequency to be used, either by table look-up or by an algorithm. Once chosen, the microprocessor 201 selects the appropriate digital-to-analog hop setting and outputs the hop setting to the digital-to-analog 203. The digital-to-analog converter 203 in turn sets a new voltage level onto the voltage input 218 of the voltage control oscillator (VCO) 207. The microprocessor 201 then enables 213 the VCO 207. The VCO 207 then begins to oscillate at the frequency selected by the voltage control input and the frequency setting resonant element 208. The frequency setting element can be any appropriate resonant or phase delay device(s). The quality factor Q and temperature stability of the resonant element must be great enough to prevent drift outside of allowed FCC bands. The maximum drift and frequency uncertainty must be determined. Then a "guard band" for larger than the maximum uncertainty must be provided on both sides of the intended transmitted bandwidth so that inaccuracies in the frequency setting elements do not cause transmissions in disallowed frequency bands.

If the frequency setting element 208 were not stable enough to meet these FCC requirements with a reasonably small "guard band", then an optional divider 209 can be used to lower the carrier frequency to rates which can be digitally inputted and counted by the microprocessor 201 to determine the frequency of VCO operation. The microprocessor 201 can then generate a frequency error offsetting term to the digital-to-analog converter 203 to generate an offsetting voltage. A voltage input of the VCO 207 receives the offsetting voltage so that the VCO 207 is then adjusted by the offsetting voltage to within a required tolerance range. This method has the advantage of not having to run closed-loop, nor be highly accurate, since this method only needs to achieve the "guard band" requirements so that inaccuracies in the frequency setting elements do not cause transmissions in disallowed frequency bands. Further, if the VCO 207 drifts during the brief message, then the receiver can track and compensate for the drift after the receiver initially attains a lock on a transmitter.

Once on frequency, the microprocessor 201 enables subsequent or final radio frequency amplifiers, embodied as the radio frequency (RF) output 212, which in turn generates a signal on the antenna 213. The microprocessor 201 then modulates the carrier frequency with the PREAMBLE SYSTEM CODE, which can be a repetitive five bit code which contains part of the transmitter's unique larger system code. The modulation of data can be FSK via resistor R2 206 or BPSK 210 or ASK 212, or any other appropriate modulation means.

The transmitted preamble 214 is sufficiently long enough for the receiver to a) search the entire radio band available, b) lock-on the transmitter carrier, and c) validate the PREAMBLE SYSTEM CODE 217. Further, preamble time is provided so that unrelated PREAMBLE SYSTEM CODES or impulse noise can be analyzed and rejected with enough time reserved to recognize and intended PREAMBLE SYSTEM CODE. Once the preamble is complete, the transmitter then sends its message-data signal 215 via one of above data modulation means. The message-data signal is then followed by a cyclic-redundancy-check (CRC) 216 error correction/detection code to ensure data integrity by detecting and correcting error bits appended to the message-data.

If the frequency setting process were highly stable, then the four least-significant bits of the digital-to-analog converter 204 can be used for channel selection, providing for system co-existence on a non-interfering basis. These adjacent channels can be thought of as the last three or four significant bits of the digital-to-analog input to the VCO 207. The most-significant-bits are controlled by a pseudo-random "hop frequency" generator. The least-significant bits stay fixed and cause a permanent but small frequency offset in the VCO 207. Providing both the receiver and transmitter use the same offset, the two are able to communicate. A system with a different offset is suppressed by the frequency selectivity of the receiver and ignored.

This hopping technique can be readily made hybrid by additionally modulating the VCO 207 carrier with other direct sequence methods.

Figure 3:
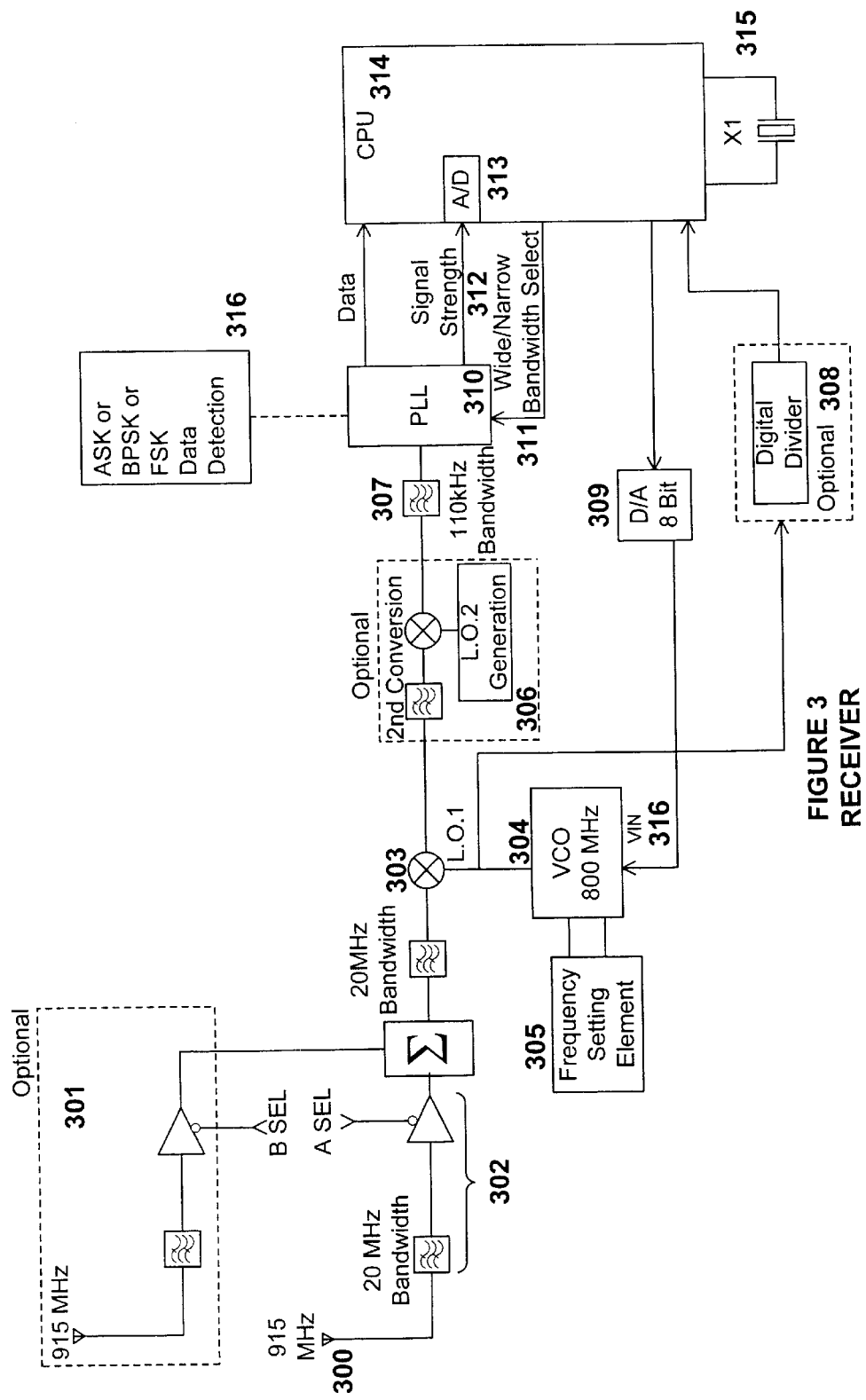
FIG. 3 is a block diagram of a frequency agile receiver.

Referring to FIG. 3, a 915 MHz modulated carrier is introduced into antenna port 300 then filtered and amplified by section 302. If spatial diversity is desired, an optional section 301 can be added and controlled by generally known means to lower occurrences of selective fading.

Mixer 303 receives a local oscillator signal which is generated by a voltage controlled oscillator (VCO) 304. The frequency of the VCO 304 is set by a frequency setting element 305 and by the voltage preset on the voltage control input, VIN 315. The voltage control input VIN 316 voltage is generated by a digital-to-analog converter 309 or by any other appropriate linear means which can produce a controllable voltage ramp.

If the frequency setting element 305 has a poor absolute accuracy, or time, or temperature drift, an optional divider 308 can be used for correcting frequency error. The divided down result is compared to the crystal 315 of the microprocessor 314 which then produces a frequency error offsetting voltage via the digital-to-analog circuit 309.

The down converted output of the mixer 303 can be immediately demodulated or passed first through an optional second conversion state 306.

In the preferred embodiment, prior to data demodulation, the signal is first band-limited by a fixed frequency and bandwidth filter 307. The signal is then decoded by the data demodulator. The demodulator means 316 or 310 must match the transmitter's data modulation utilized.

In the preferred embodiment, a phase lock-loop (PLL) 310 is used to detect FSK modulated data. The available frequency spectrum is initially swept through and monitored via a wider PLL loop intermediate frequency bandwidth selected by wide/narrow bandwidth select 311, so that the entire available bandwidth can more quickly swept through. The energy detector, carrier lock-detect, quieting detector or equivalent means must have a very rapid response time, which should exceed the impulse response time of the filter 307 that is, 1/110 kHz=9 microseconds, in this example.

Once the carrier is initially detected, a more narrow bandwidth can be selected by 311 which is more representative of the data bandwidth required for the elected data rate. This narrowing of the bandwidth improves the carrier to noise ratio. The microprocessor 314 or other linear means then can be used to close the frequency control loop and track and compensate for further transmitter or receiver drift components.

If the drift components are minimal, and the transmitted message brief, a frequency control loop will not be needed. At this point, data can be demodulated. Alternatively, if the PREAMBLE SYSTEM CODE does not match, noise and interference in occupied portions of the radio spectrum can be identified and skipped ever while the transmitter transmits.

If the transmitter is hybrid modulated with other spread spectrum modulation, such as direct sequence, then direct sequence demodulation must also be added after the hopping frequency is locked on. This would be an opportunity to include in the combination a simple parallel correlator means to decode data. Such a combination would be well suited to time-off-light radio location applications. The hop sequence would be optimized for anti-jam and the parallel correlator optimized to "time stamp" the incoming message.

As an alternative to controlling the voltage input of a voltage controlled oscillator 304, a numerically controlled oscillator or a frequency synthesizer may be used, or any method as is known in the art which can select a frequency based on a control input. If AGC blanking is employed by 'turning off' the front-end of the receiver, then the rise and fall times of the amplifier 302 and/or circuit 301 can be controlled in order to reduce unwanted bandwidth expansion from the effective amplitude modulation resulting from the rapid blanking control signal. Alternately, the narrowest IF, or baseband, filter can be dumped during the AGC transition time.

As an alternative to the D/A converter 309, dedicated hardware can be implemented which provides a monotonic increasing or decreasing ramp or saw tooth waveform. Such implementations are well known in the art and can be fashioned from operational amplifier integrators.

The frequency agile receiver voltage controlled oscillator 304 also may be designed such that the narrowest IF filter is not the last one in the receiver's IF line up. It is further possible to use the voltage controlled oscillator 304, or an equivalent, to sweep a second local oscillator or any other intermediate frequency conversion stage in the receiver's IF line-up.

The "wide/narrow bandwidth select" signal 311 could alternatively be used to select a "chirp/conventional" type filter. The phase-locked-loop circuit 310 could be replaced with any of the IF/baseband filter approaches described herein. The D/A converter 309 could additionally provide the AGC control signal with appropriate sample and hold circuits, or an additional D/A converter could be provided for that purpose.

Figure 4:
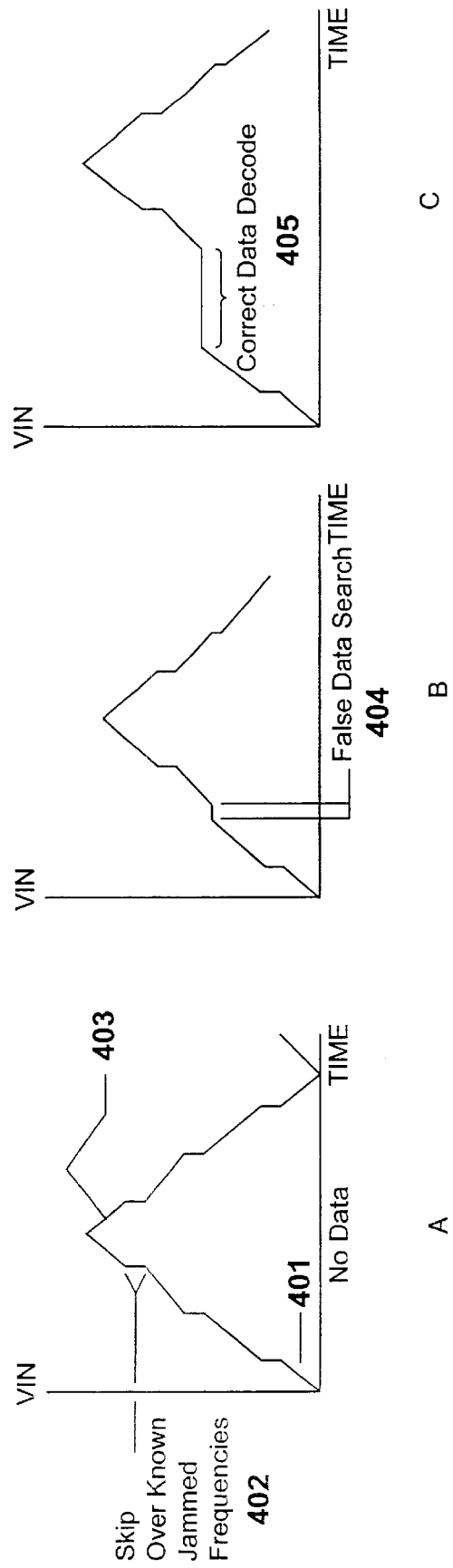
FIGS. 4A–4C shows the frequency sweep over the available spectrum by a receiver to identify noise, interference or data.

FIGS. 4A–4C illustratively shows the frequency sweep operation of the present invention. In normal operation, the receiver sweeps over the available spectrum to identify cases of noise, interference or data, and to store such identified portions of the spectrum in a jammed channel list. When no data and no new interference since the last memory update of the jammed channel list is detected during an associated time-out period and after a plurality of failed attempts to detect new data or interference have occurred, the VIN 316 input appears as depicted by FIG. 4A. The VIN will linearly sweep 401 until the microprocessor 314 determines, via the microprocessor's list stored in memory, a frequency to skip over 402 while the receiver is receiving. Once the maximum frequency point is reached, the VIN 315 input reverses the direction of sweep 403, in order to minimize the required impulse response of the VCO 304.

If new impulse noise or jamming were detected 404, such noise or jamming causes the CPU's 314 algorithm to temporarily stay on that frequency. The algorithm then attempts to decode a 5 bit PREAMBLE SYSTEM CODE. If that were not possible, then the VIN 316 sweep resumes its normal path. The PREAMBLE SYSTEM CODE can also be Grey coded or Manchester encoded so that impulse noise could be more rapidly detected as an illegal sub-sequence without having to monitor all 5 bits.

If the PREAMBLE SYSTEM CODE 217 matches, then the VIN stays constant 405 or in-track with a drifting input frequency 300 if a frequency locked loop (FLL) is used, so that transmitter and receiver frequency drift is compensated. The processor 314 then attempts to decode a data message 215 and CRC 216. After completion of the message decode, the normal search algorithm resumes and the previous path of VIN 316 continues.

Performance can be further enhanced by not skipping over the occupied portion or portions of the band, but rather by dynamically predicting future noise and jamming signal strengths and then only attempting to decode future signals which are higher than those predicted levels. If a future desired signal were lower in power than a jamming level, then the signal-to-noise ratio is too low for the data to be decoded and, therefore, the frequency agile receiver should avoid dwelling on those frequency bins. If, on the other hand, a future desired signal were higher in power than a jammer or a background noise level, and were higher by an amount at least equal to the carrier to noise ratio required to decode data at an acceptable bit error rate (BER), then the frequency agile receiver should dwell on that frequency and attempt to decode a PREAMBLE SYSTEM CODE and/or voice or data.

The frequency agile receiver seeks to eliminate dwells on frequency bins which contain unrecoverable messages. The frequency-agile receiver should not waste time during the scanning portion of the algorithm, as such waste may prevent the receiver from finding an otherwise recoverable desired signal residing in an unoccupied portion of the spectrum later in the frequency sweep. Therefore, if the frequency agile receiver had a 'perfect' prediction of the background noise, jamming and interference contained within the frequency band in use, then the frequency agile receiver algorithm would be able to optimally either dwell on a new signal which exceeded that prediction, or minimize wasted dwell time and continue the sweep into other potentially useable areas of the spectrum. The goal of this technique is therefore accurate prediction. The receiver's algorithm should seek to use information gathered both in the current frequency sweep, as well as information collected from previous frequency sweeps, to make the best prediction of what the background noise, jamming and interference environment will look like in the next successive frequency sweep, which may be only one or several milliseconds in the future.

If the types of interferers could be identified, then prediction could be made easier or more accurate. There is a wide breadth of potential jamming and interfering sources which may appear in the unlicensed portions of the radio spectrum which are attractive for operation due to FCC regulatory considerations. The types of jammers which may appear in these bands include on/off keyed devices, and fast and slow frequency hopping devices, including data sets and portable telephones. Portable phones include those which find an initially unoccupied frequency and remain on it for the duration of a conversation, as well as those which are continuously frequency-hopped according to the FCC's definition. Such frequency hopping devices are likely to dwell on any single frequency in the range of 1 ms to 400 ms.

Other potential jammers include direct sequence devices operating at either low or high baud rates. The low baud rate devices typically occupy 1–3 MHz of bandwidth with dense spectral line spacing. The high baud rate devices require high chipping rates in order to achieve the required FCC process gain. If the data is not being richly modulated, these high chip rates lead to sparsely spaced spectral line peaks. Depending on data modulation type, such high chip rates can lead to sparsely populated peaks filled in by energy valleys over the entire spectrum used, which is likely to be 20–60 MHz.

Amateur video transmission may also be found in these bands, as well as continuous wave (CW), continuous transmitting jammers such as pilot tones, or unintentional harmonics caused by lower frequency licensed or unlicensed devices or FCC Part 15.249 devices. Fast fading effects from mobile user transmissions and slow fading effects, such as those experienced in a building at night, will also need to be considered. Taken as a whole, there are wide areas of bandwidth which are either unused, of low intensity, or which are unused during those periods in between burst type transmissions.

The instant invention can also be used in a two-way transceiving system. Such a system takes advantage of dynamic reallocation of hop channels, providing that the number of hop channels exceeds that number required by the FCC's regulations. For example, a receiving device can transmit a map of its background noise, jamming and interference environment to a distant transceiver such that the transmitter associated with that distant transceiver can reallocate transmitting frequencies to concentrate on those frequencies of the receiver that are least occupied.

These considerations taken, the frequency agile receiver can use an algorithm which sweeps in a linearly increasing frequency and then resets to an initial frequency, sweeps in a linearly decreasing frequency and then resets to the initial value, sweeps in a ramp-up/ramp-down fashion, or searches over a pseudo random order of the available frequency bins. A frequency 'bin' is set by the most narrow intermediate frequency (IF) or baseband filter, or a portion thereof, which is being analyzed by the receiver in one unit time. In addition, the receiver can skip over portions of the band which are too densely occupied to be of value and seek to extract useable information from two separate portions of the available band, which may be removed in frequency from one another by many megahertz.

In a preferred embodiment of the instant invention based upon prediction, a present measured signal strength or quieting or signal lock quality reading from an individual frequency bin is compared to the last best prediction of the noise, jamming and interference in that bin. The receiver does not dwell on that particular frequency bin unless the presently measured signal strength or quieting or signal lock quality reading is higher than the predicted environment level by an amount roughly equal to the carrier-to-noise ratio required to decode a valid message. Once this threshold is met, the receiver will 'TRIP' and dwell on that channel for the amount of time necessary to determine if valid data can be extracted from that frequency bin.

The algorithm then falls into three modes: NORMAL MODE, TRIP MODE and RECOVERY MODE. In NORMAL MODE, the radio spectrum is scanned and radio energy received from background noise and from manmade jamming sources which is at approximately static power output is processed. Small variations in received power do not exceed the dynamic tracking available in the frequency agile receiver's algorithm and therefore do not cause an entry into the TRIP MODE, i.e., associated fading changes of known jammers are either sufficiently small or slow so that the modulation form on the jammer will either have slow variations in time or small variations in signal power. The goal during these occurrences of slowly varying signals in NORMAL MODE is for the frequency agile receiver algorithm to apply averaging to these sources of radio energy which, in fact, tend to average to a roughly static level.

The next mode of the frequency agile receiver's algorithm, TRIP MODE, is triggered when a signal exceeds the predicted level plus the required carrier to noise ratio, signaling the potential for decoding a valid message. The receiver's algorithm enters the TRIP MODE when subjected to rapidly changing background noise or a manmade jamming source which is impulsive in nature, from other hoppers either fast or slow, from a new transmitting source which has just been turned on, from fast constructive fading from an existing transmission, from a larger modulation variation of a transmitter which has already been on, or as the result of multi-tone IMD products in receiver. The last source of a TRIP is that of a VALID signal.

A VALID signal may contain a correct PREAMBLE SYSTEM CODE, in which case useable data may be recovered. A VALID signal may also result from a PREAMBLE SYSTEM CODE from a similarly coded frequency agile transmitter but one which was not intended or desired by the receiving system. This is possible since the PREAMBLE SYSTEM CODE is used in a fashion similar to that employed with Code Division Multiple Access. A VALID but unwanted signal message would be discarded prior to data decode. In either VALID case, the receiver's algorithm typically does not seek to alter the prediction variables. Alternatively, if VALID messages from similarly coded systems are anticipated to be long in duration, the receiver's algorithm can be implemented to rapidly alter the prediction variable.

Lastly, there is RECOVERY MODE. When a jammer goes away, or is reduced in unwanted signal energy, the receiver's algorithm seeks to make that portion of the radio band available as rapidly as possible.

In view of the three modes and the different needs of each, the present invention proposes a dual algorithmic prediction approach. One portion of the algorithm attempts to apply averaging to those signals which are anticipated to remain within a relatively static range. The other portion of the algorithm tries to rapidly adjust to a signal which is likely to have large fluctuations in signal strength. This dual approach yields a type of hysterisis, such that if the signal stayed within a predetermined window, or within a dynamic TRIP LEVEL range, then the algorithm performs averaging within that window. If the received signal fell outside of the predetermined window, or the dynamic TRIP LEVEL range, then the receiver's algorithm seeks to rapidly match that new reading. This can be accomplished with classic hysterisis or windowing techniques. Alternatively, rate of signal change can be tracked. Rate of signal change methods which are common in the art include Type II servo loops which seek to match or anticipate second or third order, rate of change phenomenon.

It is important to provide means in the receiver's algorithm such that 'one time' events have a minimal skewing effect on the prediction algorithm. One time events can come from very rapid fading, frequency hoppers, rapid impulse noise, or large but infrequent modulation deltas. In addition, statistics can be maintained on each frequency bin measured to show the percentage of successful transmissions received, or the percentage of successful data throughput over a unit of time. Since frequency hopping transmissions will be randomized over the frequency band available, if there is no jamming present in the frequency band in use, then all of these statistical successes will be roughly equivalent. Statistics can also be maintained on the number of false TRIPS experienced in each frequency bin. The receiver can then take advantage of this information to either initially, or dynamically, reallocate the channels by either ignoring those channels exhibiting excessive false TRIPS and thereby preventing wasted dwell time, or sending information to the associated transmitting devices so that the transmitting devices avoid utilizing those frequency bins in future transmissions. If frequency avoidance is used, the transmitter still transmits on a specified number of channels sufficient to meet FCC requirements.

A goal of the frequency agile receiver is to sweep the available band as rapidly as practicable while providing as much resolution per frequency bin as possible. A further goal is to yield an accurate representation of the radio environment, while minimizing signal strength loss. The receiver may therefore take one or more signal strength or quieting detection or signal lock quality samples per transmitted bandwidth. The receiver also sweeps as rapidly as possible in order to minimize the required transmitter preamble time and make a finer time resolution prediction. The last IF filter, or the one with the narrowest bandwidth, is the filter that is most affected by these requirements and is, therefore, the filter that sets the limit of performance.

Typically, in a conventional filter, as a signal is swept through it at, or approaching, a time proportional to the reciprocal of bandwidth, two limiting effects occur. First, the filter loss increases, thereby reducing the effective sensitivity of the resulting receiver. Second, the energy from a previous frequency bin dwells in the filter while the next frequency bin is being analyzed. The energy dwelling from frequency bin to frequency bin is a form of ringing, and is due to the infinite response time of the filter. The dwelling energy from frequency bin to frequency bin makes measurements appear to smear into one another. Thus, the energy from a strong jammer will dwell in the filter one or more sample times delayed and can be greater than an otherwise decodeable desired signal having a weaker signal strength.

There are several ways to minimize these two effects on the performance of a rapidly sweeping frequency agile receiver. The method previously described using two different IF filter bandwidths can be beneficial. The step using a wide bandwidth filter is used initially during the sweep time. The wide bandwidth filter has a faster response time than a narrow bandwidth filter. The wide bandwidth, however, allows additional noise to be placed within the filter, thereby reducing the effective sensitivity of the receiver and equivalent process gain. Once the desired signal is acquired, a narrow bandwidth filter is used when decoding the data portion of the message, while the receiver is no longer slewing the VCO.

A method which overcomes this previous shortcoming is to use a chirp filter matched to the sweep speed of the receiver's slewing VCO. The effective bandwidth of the chirp filter can be matched to the desired incoming signal. The chirp filter reduces the effects of ringing or smearing from the filter, and at the same time achieves full receiver sensitivity. Once the initial signal is acquired during the sweep mode, the receiver stops sweeping the VCO and switches to a conventional narrowband filter matched to the data bandwidth, prior to attempting to decode data.

An alternative to using the chirp type filter during the acquisition phase is to use an IF filter with the narrowest bandwidth or baseband filter, match that filter bandwidth as closely as possible to the bandwidth of the transmitted signal, and then provide means for dumping the filter after each sample. This technique eliminates smearing due to signal energy dwelling in a filter during subsequent samples. Another approach is to use a filter designed with a finite impulse response (FIR) so that unwanted energy cannot linger in the filter. When using the foregoing approaches, the chosen filter should have a fast response time, or signal energy will be lost in fast sweep/fast sample implementations, effectively reducing the sensitivity of the receiver.

A further approach is to use a digital signal processor (DSP), or the equivalent, to provide a fast Fourier transform of a section of bandwidth equaling one or more frequency bins simultaneously. A DSP can also simultaneously implement multiple narrowband filters, thereby increasing the effective sweep speed of the radio spectrum utilized. A DSP algorithm can be flexible, and may implement a chirp type filter during the sweep portion of the receiver algorithm, and/or a narrow band conventional type filter once the algorithm locks to a single frequency.

Another approach is to use a single IF filter which has excellent impulse response time as well as desirable ringing/smearing characteristics. Attractive results have been achieved by both guassian and synchronous filters. The shortcoming of these filters is that the skirt roll-off degrades with high signal levels. These filters work well in combination with AGC strategies, as described below, to minimize the peak energy which may be introduced.

The receiver 310 may use any of several filter implementations, with the chosen filter providing desirable results, which may be enhanced by the foregoing approaches. The filter implementations include use of a phase lock loop design, a DSP filter, an appropriate surface acoustic wave (SAW) implementation, a switched capacitor bank, or any of the classic active filter techniques having filters modified for dumping their energy storing elements, e.g., capacitors. In these filter implementations, the leading edge of the filter should be as sharp as practicable during the condition when the filter is being swept at a rapid rate. The benefits of the sharp leading edge include narrowing the effective bandwidth, improving the co-channel performance, and improving resistance to the effects of nearby jamming signals.

Prior to anticipated higher levels of jamming, the sweep speed of the VCO can be slowed down so that the filters can settle, or the sweep speed of the VCO can be significantly increased such that very little energy is collected by the narrowest IF or baseband filter.

A further alternative, which can be used with the foregoing methods, is to provide automatic gain control (AGC) at the front-end stage, or at an intermediate frequency stage, of the receiver. The AGC can be in the form of on/off signal blanking, e.g., gain dumping, or may be in the form of smaller incremental steps operating over a wide dynamic range. If the AGC uses smaller incremental steps, then the receiver's algorithm can attempt to match the AGC signal to that of the incoming signal such that the resulting RF output of the front-end stage of the receiver yields a nearly level signal strength envelope as the local oscillator is swept. Using an AGC with smaller incremental steps reduces undesirable effects from the AGC control signal, which would tend to expand the bandwidth of an incoming RF signal and could cause the equivalent of smearing. This AGC strategy can also serve to reduce the effects of front-end signal compression and of undesired intermodulation components which may be created by non-linear operation of subsequent receiver stages.

If the AGC used 'on/off' blanking, then undesirable amplitude modulation artifacts may result from a rapidly changing AGC control signal. It is therefore desirable to moderate the ramp speed of the 'on/off' control signal. Such moderation techniques are well known in the art.

The drawback with a full AGC approach is that the receiver's algorithm primarily uses time cues in order to decrease the level of predictions of future noise, jamming or interference sources. With a full AGC approach, the AGC circuits eliminate signals which have fallen below immediate predicted levels and therefore make these signals unmeasurable. A compromise approach to full AGC, is to allow a portion of the RF signal energy to be above the noise floor and therefore remain measurable. This compromise approach allows the receiver algorithm to take advantage of those measurements to more rapidly predict decreasing levels of noise, jamming and interference. The compromise approach allows most of the unwanted anticipated signal energy to be eliminated in the very first stage, or early stage, of the receiver and still provides very robust performance.

The architecture of the frequency agile receiver can be designed with a digital-to-analog converter, driving the AGC circuit with sufficient resolution so that the resulting received signal strength indication (RSSI) level is compared against a single TRIP LEVEL. With such an architecture, the resulting RSSI level, or quieting output level, does not have to be analog-to-digital converted, thus reducing the cost and complexity of the architecture.

In the typical AGC approach, the receiver's first section 301, and/or section 302 is either blanked or replaced with a circuit capable of variable gain and/or variable attenuation. Further, the AGC or blanking circuits can be distributed in the receiver's IF strip for reducing cost and improving performance. It is, on the one hand, desirable to reduce unwanted signal power immediately at the front-end of the receiver. It also is desirable to place a variable attenuator after an IF filter or baseband filter which is as narrow as practicable, but which does not create the limiting factor of ringing or smearing. The bandwidth of the filter 307 would likewise be increased such that the impulse response time and signal loss of filter 307 would not be a factor to the following stage.

A further enhancement to the receiver's prediction capabilities is to provide an adaptive TRIP LEVEL. The adaptive TRIP threshold has several areas of value. As the receiver sweeps through the available band at increasingly rapid rates, the narrowest bandwidth RF, IF, or baseband filter will increasingly attenuate the received signal, due to response time. It is, therefore, desirable to TRIP the algorithm in the most sensitive manner possible while at the same time not creating so many false dwells that the receiver is likely to entirely miss a preamble of a valid transmission on a later frequency. This can be accomplished with the support of the software filters which seek to predict background noise, jamming, and interference. The TRIP threshold can be effective even at extremely low values, such as 3 dB.

The system of the instant invention seeks to balance sensitivity with robustness against a hostile environment. In order to be consistent with this approach, the PREAMBLE SYSTEM CODE can be designed to allow for a single bit error within its repetitive sequence and still uniquely decode the preamble's ID. This approach typically expands a 5 bit code to more than five bits. Designing this facility into the coding of the PREAMBLE SYSTEM CODE effectively provides for single bit error correction, making the PREAMBLE SYSTEM CODE more robust, while at the same time lowering the needed $E_B/N_0$ to successfully decode the PREAMBLE SYSTEM CODE bits. This approach is consistent with very low TRIP levels. For example, if a 5 bit PREAMBLE SYSTEM CODE were expanded to 10 bits, to allow for one bit of error tolerance, then a bit error rate as low as $1 \times 10^{-1}$ would provide usable results. The $E_B/N_0$ required for such a low bit error rate, depending on modulation type, can be as low as 1 to 3 dB.

It is usually desirable to rapidly discard a transmitted message which is not intended for, or desired by, the receiving device. This may be accomplished by comparing further repetitions of a PREAMBLE SYSTEM CODE in the transmitted preamble and, if a subsequent code does not match, to abort the message. Additionally, a 'full' system code in the transmitted message, representing hundreds or even millions of unique systems, can be matched against a full system code which is stored within the frequency agile receiver's memory means.

The frequency agile receiver can store a table of desired transmitter identification's (ID's) in memory means. The transmitter ID, or full system code, can be located near a 'data start' marker at the beginning of the data message. If the ID code or full system code does not match with one of the desired codes stored in the memory means, then that message can be aborted without forcing the receiver to dwell for an entire message time. The 'data start' pattern can be provided by either embedding an illegal bit sequence, such as three or four sequential 1's or 0's in a row, or the data start pattern can be a reserved orthogonal PREAMBLE SYSTEM CODE. Since the PREAMBLE SYSTEM CODE can be so robust, the following portion of the data message would benefit from an interleaved forward error correction scheme which approximates the robustness of the PREAMBLE SYSTEM CODE.

A wide range of modulation types may be used with good results in the instant invention. In general, the modulation type should use the least amount of bandwidth possible while maintaining a very rapid skirt roll-off. Desirable modulation forms include, but are not limited to, low index FSK, SFSK, FFSK, MSK, and GMSK. A narrow bandwidth utilized at the transmitter allows for a narrower bandwidth to be used at the receiver, serving to increase sensitivity and to better reject jamming and interference. Conversely, as the bandwidth is widened to allow for increasing data modulation rates, the overall message dwell time is reduced. Brief messages are desirable to avoid the effects of a rapidly changing RF environment and of undesirable interferers such as frequency hoppers. Minimum bandwidth is desirable for co-channel isolation and to minimize the amount of undesirable signal energy which can be introduced into the narrowest IF filter or baseband filter. Specific applications of the instant invention can be evaluated to make this trade-off.

The frequency agile receiver can be applied to transmitters which do not transmit on a multiplicity of pseudo random frequencies. In such a case, the receiver provides the benefit of automatically eliminating frequency uncertainty caused by an unknown transmitter frequency. This reduces the cost of frequency setting elements while optimizing receiver sensitivity by permitting bandwidths approximately equal to the bandwidth of transmitted voice or data. This provides an attractive approach for cordless phones and PCS applications.

Figure 5:
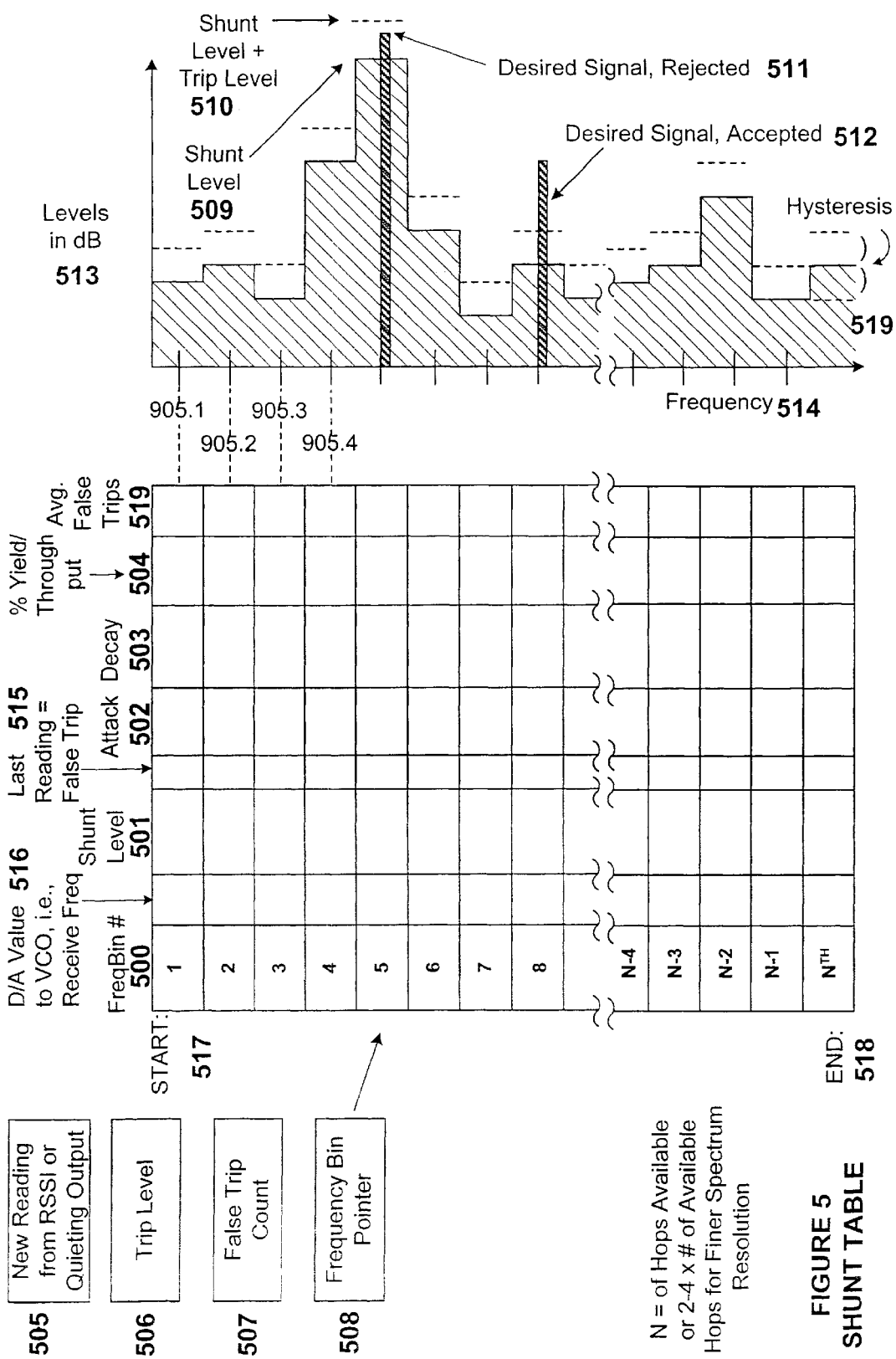
FIG. 5 shows a shunt table.

FIG. 5 shows a shunt table. The shunt table is stored in memory means and is updated either during system setup and/or dynamically through ongoing system operation. The purpose of the shunt table is to associate frequency bins, relating to received frequencies, i.e., a current or voltage input of the receiver's VCO or synthesizer divider inputs, to other information concerning the past history of that frequency bin. Past history information can enhance predictions of future anticipated noise, jamming level or interference level within that frequency bin. Each frequency bin may be either approximately equal to the bandwidth of the transmitted signal or may represent a fraction of the bandwidth of the transmitted signal. It is also possible to make the frequency bin wider than the transmitted bandwidth, which can improve sweep speed but does not optimize sensitivity.

The frequency bin number 500 can be stored in the shunt table as a variable. Alternately, the frequency bin number 500 can be associated with a physical memory address in a table whereby an offset number can be used at a start 517 address to index into the table. The end 518 of the table represents 'n' entries which equal the number of hops available or practically 2–4 times the number of available hops utilized by the transmitter to provide finer spectrum resolution at the receiver. Optionally, the D/A value controlling the receiver's VCO 516 can also be stored in the shunt table. This value is the equivalent of the selected receive frequency. The advantage of storing the frequency bin number 500, or of storing the value of the D/A converter which drives the voltage input of the receiver's VCO 516, is that the receiver algorithm can then skip through a wide variety of frequencies which may not be adjacent to one another. This further helps facilitate systems which take advantage of dynamic reallocation of frequencies.

Each frequency bin is associated with a SHUNT LEVEL 501 which represents the prediction from the receiver algorithm's previous frequency sweep(s). The next piece of information, which is optional, is a single bit which indicates that the last reading taken from that frequency bin was a false TRIP 515. This bit can be replaced or augmented by the following optional variables. Attack 502 may be stored to provide a second order representation of the rate of rise of undesired signal energy. It can be used as part of a servo loop to track an increasing level of jamming energy in this frequency bin. Decay 503 provides the same functionality as attack, but is used for jamming signals which are reducing in signal energy.

Percent yield 504, which is optional, may maintain a figure of merit relating to the success of the receiver algorithm in extracting usable desired messages from that frequency bin. The average false trip 519 table entry, which is optional, tracks the number of false dwells that occurred on that frequency bin which may have been caused by impulsive jammers. This information can then be used to either avoid spending receiver dwell time on that bin or as a method to transfer this information to the associated transmitting device such that the transmitting device will either avoid or/and make fewer transmissions on a frequency with low yield or high false trips.

In addition to the shunt table, several registers are used by the receiver's acquisition, TRIP handling and data decoding algorithms. A register is used to store new readings 505 from the receiver's A/D converter 313 relating to signal strength or to quieting or to signal lock quality information. The algorithm also uses a register to store TRIP LEVEL 506. The TRIP LEVEL 506 can be either statically set as a system parameter, or can be dynamically determined by the receiver's algorithm. Dynamic determination facilitates use of a minimum TRIP LEVEL to increase the effective sensitivity of the receiver while simultaneously minimizing the number of false TRIPS to an acceptable level. Another register stores a false TRIP count 507 for the receiver's algorithm to determine an acceptable number of false TRIPS. This figure in turn helps the receiver's algorithm determine a dynamic TRIP LEVEL 506.

The receiver's algorithm sequences through the frequency bins in either a linear, incrementing or decrementing ramp form, or in a pseudo random form. The algorithm uses a frequency bin pointer 508 as an index into the position of the shunt table currently under measurement by the receiver's hardware.

A graphic representation of a portion of the data contained within the shunt table is shown on the associated graph of FIG. 5. The axis of the graph are indicated as levels in dB 513 and frequency 514. The shaded area shows the SHUNT LEVEL 509 stored in the shunt table. The dashed area shows the SHUNT LEVEL plus the TRIP LEVEL 510 which must be exceeded in order for the receiver's algorithm to TRIP and dwell on that frequency bin. A desired signal 511 is shown which is below the SHUNT LEVEL plus TRIP LEVEL 510, and is therefore rejected as unrecoverable. Such a signal would not provide a sufficiently high carrier-to-noise ratio to reliably decode a message. A desired signal 512 is shown above the SHUNT LEVEL plus TRIP LEVEL and causes a TRIP of the receiver's sweep algorithm such that the receiver dwells on that frequency bin and correctly decodes the desired signal. Alternately, both the SHUNT LEVEL and the TRIP LEVEL can be summed prior to storage in the shunt table. The hysterisis range around the SHUNT LEVEL is shown as 519.

Figure 6:
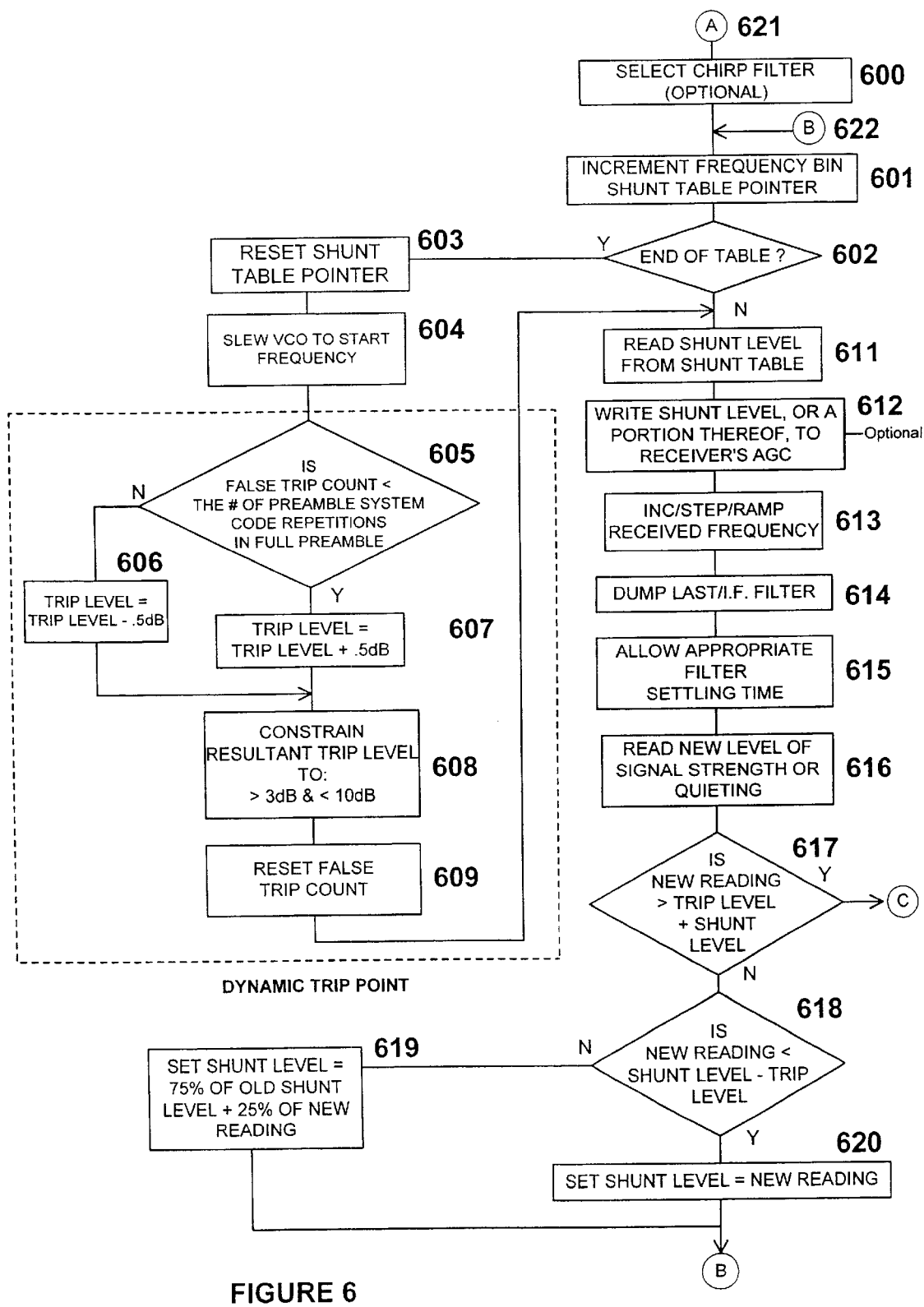
FIG. 6 illustrates a frequency scan algorithm.

Referring to FIG. 6, the receiver software includes an algorithm to sweep or pseudorandomly step through a list of frequencies contained in the shunt table. The TRIP handler seeks to identify if the TRIP is a result of a desired message or undesired noise, jamming or interference. If the TRIP was due to undesired noise, jamming interference, the TRIP handler readjusts the SHUNT LEVEL 501 an appropriate amount.

Once the receiver software is initialized, it jumps to point 'A' 621 in order to enter the frequency sweeping algorithm. Next, if a chirp type filter architecture is optionally utilized, then the algorithm selects the chirp IF or baseband filter which is architecturally prior to the hardware in the receiver which measures either signal strength, quieting or signal lock quality. Alternatively, the sweep algorithm can be re-entered through node 'B' 622 once a pass of a single frequency bin has been completed.

Figure 8:
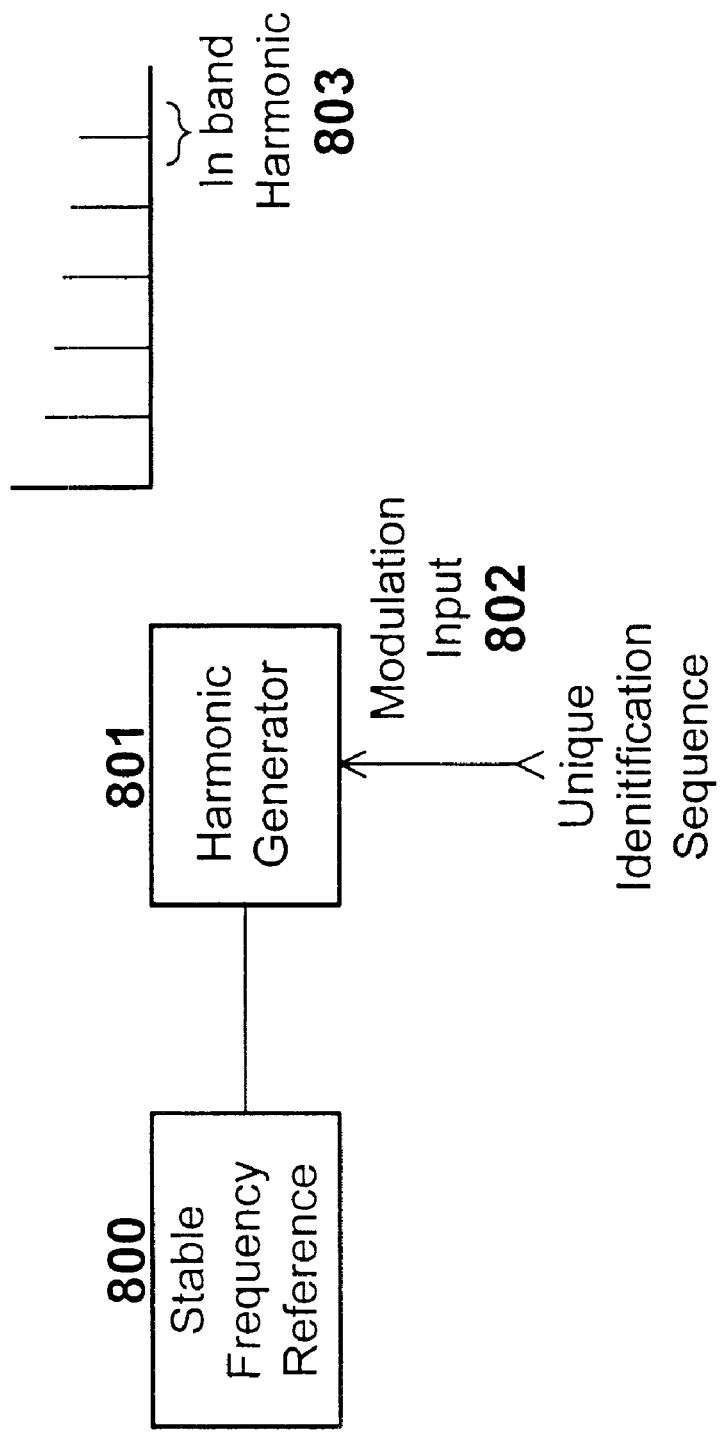
FIG. 8 is a block diagram illustrating generation of an intentional in-band jammer.

If the instant invention uses an implementation whereby the voltage controlled oscillator 304 runs predominantly open loop, then occasionally an additional step may be used to calibrate the voltage controlled oscillator 304 to a known reference such as a crystal 315. This is repeated in a time interval which is less than the maximum acceptable receiver frequency drift. This frequency measurement computation can be accomplished through the optional digital divider 308 in conjunction with timer counter hardware and/or software within CPU 314 or by phase locked means. Alternately, if the voltage controlled oscillator 304 is part of a synthesizer, once settled on an initial frequency, the loop can be opened and the voltage into the voltage controlled oscillator 304 can be integrated, or ramped, by any means as is known in the art. As a further alternative, referring to FIG. 8, the voltage controlled oscillator 304 can sweep through an in-band 803 'intentional jammer' which is purposely generated 801 by the receiver's hardware. Such an 'intentional harmonic' would also be modulated 802 in a manner such that the receiver's algorithm could uniquely identify the harmonic. The 'intentional harmonic' would be generated by a stable reference 800 such as a crystal source so that it would appear at a known position in the band over which the receiver was sweeping. The algorithm within CPU 314 would then be able to use this as a known reference to correct the actual scan position of the voltage controlled oscillator 304. Additionally, more than one harmonic can be placed in-band so that a two point correction or a piecewise linear curve fit could be implemented by algorithmic means.

The frequency bin pointer 508 is incremented 601 to point to the next shunt table entry. Alternatively, the frequency bin pointer 508 can be stepped through a pseudo random sequence, or other randomizing means. Next, if step 602 decides the frequency bin pointer 508 has reached the end 518 of the table, then control of the algorithm passes to reset 603 the shunt table pointer. Next, the voltage controlled oscillator 304 is slewed 604 to the start frequency so that the voltage controlled oscillator 304 has adequate settling time prior to taking the next read. Optionally, the SHUNT LEVEL 506 is dynamically recalculated starting with a comparison of the false TRIP count 507 to the number of additional PREAMBLE SYSTEM CODE repetitions designed into the transmitted preamble 605. If the false TRIP count 507 is lower than the number of additional repetitions, then the TRIP LEVEL 506 is reduced 606 by one half of one dB, or by some other preselected amount. If the false TRIP count 507 is not less than the number of additional repetitions, then the TRIP LEVEL 506 is increased 607 by one half of one dB, or by some other preselected amount. To prevent the TRIP LEVEL 506 from increasing or decreasing into unreasonable ranges, the TRIP LEVEL is constrained 608 to a TRIP LEVEL which is greater than 3 dB but less than 10 dB. These numbers can be preselected to any desirable bounds. Alternatively, the dynamic TRIP point can be updated on every $M^{th}$ pass. Lastly, the false TRIP count 507 is reset 609.

Control is then passed to reading 611 the SHUNT LEVEL from the shunt table. The step of writing 612 the SHUNT LEVEL is optional, and may be used alternatively to augment the rest of the algorithm. The SHUNT LEVEL 501 is used either in part or in whole to control the AGC input of the front-end of the receiver. The AGC input would be in block 301 and/or block 302. Alternatively, variable gain or variable attenuation may be distributed through any part of the receiver. The step of writing 612 the shunt level can be used to eliminate or reduce undesirable signal energy which is predicted by the shunt table. The step of writing 612, therefore, reduces the amount of energy which may cause subsequent RF stages to either overload, ring or create undesirable non-linear signal components. The step of writing 612 can also be used to increase the effective dynamic range of the receiver system. A form of blanking can be implemented by simply disabling the amplifier stage in 302 and/or 301, thereby effectively reducing the input signal by approximately 30 dB. The AGC control signal also may be synchronized with subsequent filter dumping to eliminate unwanted Fourier components which may be measured on the receiver's output.

Next, the algorithm increments steps, ramps or pseudo randomly jumps 613 to the next VCO frequency. This can also be accomplished by reading a D/A, or frequency, value 516 from the shunt table. Next, the algorithm optionally may dump 614 the last narrowest IF or baseband filter. The algorithm then allows a delay 615 which is appropriate for the IF or baseband filter to settle. Once the filter settles, the A/D converter 313 reads 616 a level representing signal strength, quieting or signal lock quality. The new reading is then compared 617 to the TRIP LEVEL 506 plus the SHUNT LEVEL 501. If the algorithm stores a value in the shunt table that is equal to the SHUNT LEVEL plus the TRIP LEVEL, then the new reading is compared only to that combined stored level. If the new reading exceeds this level then control is passed to C 719 for TRIP handling. If this new reading is not greater, then the algorithm then seeks to find if the new reading is 618 less than or equal to the SHUNT LEVEL 501 minus the TRIP LEVEL 506. Effectively, this creates a hysterisis band which is plus or minus the TRIP LEVEL 506 selected. If the reading is within a hysterisis band then control passes to set 619 the SHUNT LEVEL in order to provide ordinary averaging of the SHUNT LEVEL to the newly read data. If the new reading is outside of the hysterisis band, then the algorithm seeks to very rapidly move the SHUNT LEVEL to the newly read input 620. Alternatively, attack 502 and decay 503 variables may be used from the SHUNT LEVEL to augment the hysterisis algorithm and provide means to create averaging about levels which tend to be static while simultaneously rapidly acquiring jamming signals which are changing quickly. Lastly, control is directed to B 622 whereby the algorithm repeats itself.

If the step of comparing 617 the new reading is used in conjunction with the AGC function of setting 612 the shunt level, then the SHUNT LEVEL 501 is reduced by an amount equal to that written into the AGC circuit. If gain stage disabling is employed, then the SHUNT LEVEL is reduced by an amount equal to the attenuation of the disabled amplifier, or amplifiers, such as the ones in block 302 and/or 301. Further, in AGC assisted implementations, the 'below shunt' hysterisis provided by the steps of comparing 618 and setting 620 will only be effective if the AGC value is only a portion of the total SHUNT LEVEL 501. Lastly, if the instant invention is implemented with AGC operating over the entire dynamic range of the receiver, and such that the receiver algorithm uses detected RSSI to seek a zero point, then the SHUNT LEVEL 501 can be reduced by time based decay means per FIG. 7B.

As an alternative to the above algorithms, an implementation of the instant invention may post-process TRIPS which are initially identified as increases in signal level, but whereby the algorithm does not TRIP and dwell on those frequency bins. In such an implementation, during the sweep time, the algorithm would utilize an additional column within the shunt table to indicate that the present reading yielded an increase over the prediction relating to the present frequency bin. After a complete pass of the available radio spectrum, the receiver's algorithm could then choose the most likely candidate or some transmitter to attempt to decode a PREAMBLE SYSTEM CODE, or some transmitter identifier or data. This post-processing approach would provide additional system cues to make a decision before spending time dwelling on any individual frequency bin.

Figure 7:
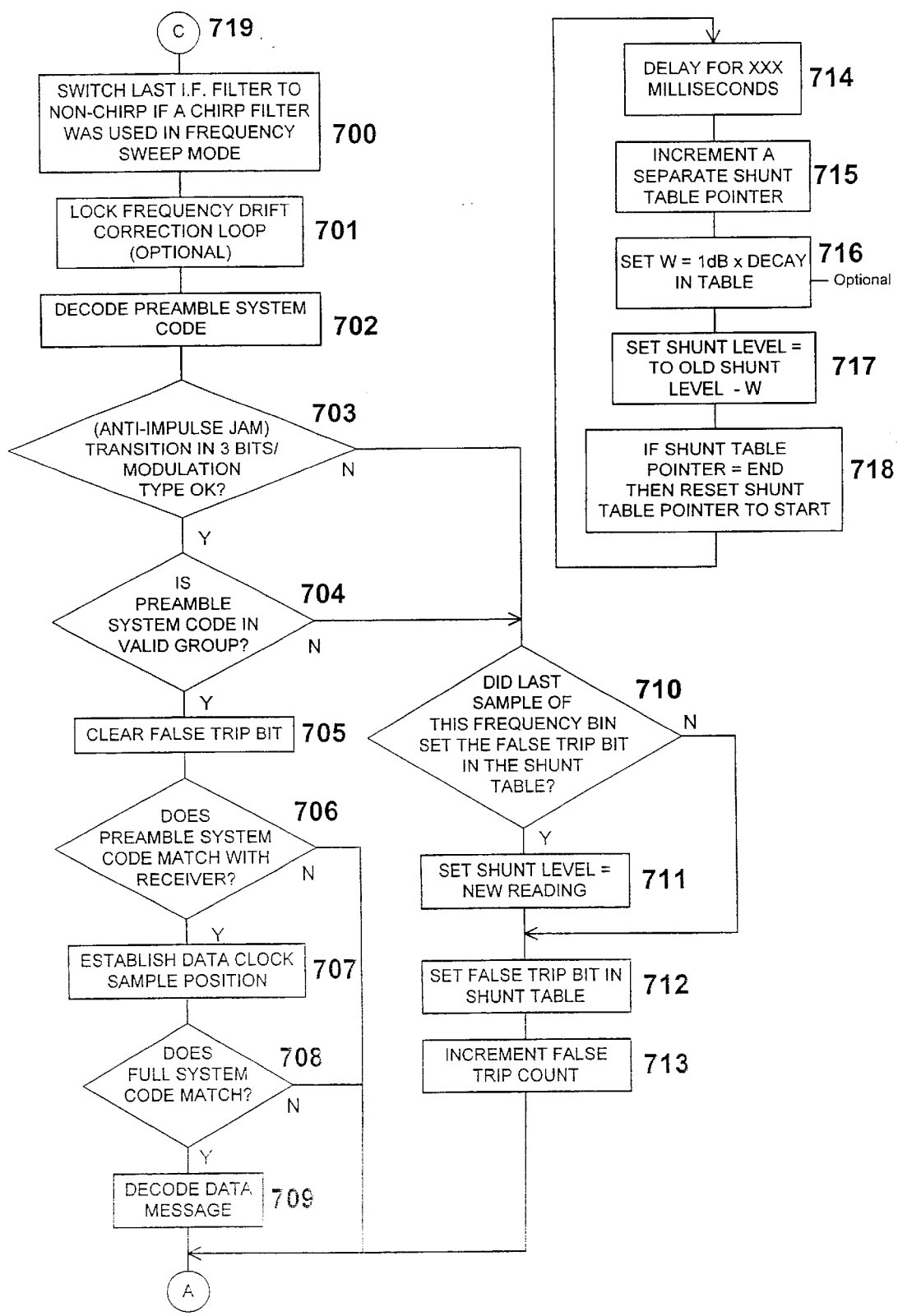
FIGS. 7A–7B illustrate algorithms for a trip handler and a time base shunt decay, respectively.

Once the algorithm in FIG. 6 is tripped, control is passed to C 719 of FIG. 7. Initially, the method deselects 700 the chirp type filter, if one has been used, and selects 700 the non-chirp alternate filter. A non-chirp filter is used during data decode since the voltage controlled oscillator 304 does not slew the receiver's local oscillator once a TRIP occurs. Next, the method may optionally use feedback means, such as a quad circuit or a frequency error output from a PLL, to provide 701 drift correction between the transmitting and receiving devices. A frequency error term is established and is used to compensate the voltage controlled oscillator 304 through the D/A converter 309 if the voltage controlled oscillator 304 is open loop. Alternatively, if closed loop means such as a synthesizer were used, then the feedback loop can be opened and the voltage controlled oscillator 304 can be directly slewed. Alternatively, if a closed loop synthesizer were used and remained closed, a directly compensating reference crystal 315 steers the output of the voltage controlled oscillator 304. This last approach has the advantage of automatically correcting the data sample clock at the same time the voltage controlled oscillator 304 frequency error is corrected. In the drift correction approaches, however, the tracking range should be governed to prevent the receiver from locking onto an adjacent, or more powerful, undesired signal.

The method seeks to decode 702 the PREAMBLE SYSTEM CODE which is repeated in the transmitted signal. This code may be repeated several extra times as determined by the anticipated number of false TRIPS in the frequency sweep of FIG. 6. The PREAMBLE SYSTEM CODE can provide timing information so that the receiver can clock data at an optimal sample point. The PREAMBLE SYSTEM CODE may be a 5–10 bit code designed with special characteristics providing cues to the frequency agile receiver so the frequency agile receiver can rapidly abort attempts to decode undesired radio energy as a message. One such characteristic cue can be detected 703 in three or four bit times, such as an illegal bit sequence and, if not found, the handler aborts to step 710. Additionally, the receiver hardware or software algorithms may be able to provide information indicating that the modulation itself is not appropriate or recoverable, in which case the TRIP handler aborts to step 710. If these tests pass, then the method seeks to determine 704 if the PREAMBLE SYSTEM CODE is in one of the several valid orthogonal groups which may be used by similar systems but which are not intended for the receiver. If the 5–10 bits subsequently received cannot be decoded 704 as a valid group, then the TRIP handler aborts to step 710. If the 5–10 bits received can be interpreted as a member of a valid group, then the algorithm acknowledges that the TRIP was not caused by jamming and clears 705 the false TRIP bit 515. Alternately, if the total message transmit time of a valid, but undesired, transmission is anticipated to last many sweeps of radio spectrum available, it may be desirable to adjust the SHUNT LEVEL accordingly, or to mark the channel as occupied or as jammed for some number of frequency sweeps.

If the PREAMBLE SYSTEM CODE matches 706 the instant receiver's preset code, then control is passed to establish 707 the data clock sample position. If the code does not match, then the algorithm passes control to A 621 so that the receiver can continue to search for possible desired signals. Steps 702, 703, 704, 706, and 707 can be combined into one hardware/software block by use of parallel correlation, table look-up or equivalent algorithmic means.

Once the data clock is established 707 then the algorithm may decode the first leading bits in the data message which may optionally contain the full system code. If the full system code does not match 708, then the transmission is not intended for the receiver and control is passed to A 621 with delay. If the full system code does match 708, then the remainder of the message is decoded 709 and is used according to the application of the system. Control is then turned to A 621 in order to search for further valid signals. In addition, the transmitter's ID may be located in the leading portion of the following data. The receiver can, in conjunction, maintain a data base of 'desired' transmitter IDs which are a subset of all possible IDs. If the new message does not match the 'desired' list, then the receiver may abort the message to prevent wasted dwell time.

In the case where the TRIP handler aborted, the method determines 710 if the false TRIP is a product of frequency hoppers or other rapid pulse jammers, which are not likely to affect the next subsequent signal reading of that frequency bin. If the false TRIP bit 515 was not set 710 in the last reading of that frequency bin, then control is passed to step 712. If the last reading of that frequency bin did 710 result in a false TRIP, then it is desirable to set 711 the SHUNT LEVEL 501 to the new jamming level. As an alternative to this approach, or to augment this approach, the attack variable 502 may be used to establish a first or second order derivative which seeks to predict the rate of rise of a rapidly increasing interfering signal level.

The method sets 712 the false TRIP bit 515 in the shunt table increments 713 the false TRIP count 507 and exits the TRIP handler, returning to A 621 to seek further desired messages.

The method shown in FIG. 7B is used if the AGC loop seeks to use the entire dynamic range of the system. The signal level cues, which are lower than the zero level of the servo loop, cannot be used to reestablish or reduce the SHUNT LEVEL 501. Alternatively, this time-based SHUNT LEVEL decay algorithm can be used to enhance or augment the other algorithms. The time-based SHUNT LEVEL decay algorithm runs in a continuous loop beginning with the step of delaying 714 for some appropriate period of time which can be in the range of a portion of a single frequency sweep or as long as many minutes. This method requires a separate shunt table pointer to be incremented 715 in order to index through the list of SHUNT LEVELS 501. An optional step may be used in conjunction with a higher order loop to calculate 716 a decay. A function controlled by the decay variable 503 sets the amount W by which, the subsequent steps, the SHUNT LEVEL 501 shall be decremented 717. The method resets 718 the shunt table pointer if the shunt table pointer has reached the end of the shunt table. The method then loops back to 714 and repeats.

As an alternative to these Van Newman algorithms, the prediction can be implemented by fuzzy logic or neural network means. The present signal strength or quieting reading in any frequency bin can be input, as well as other cues, to re-train the network and to yield results which adapt to the radio environment, background noise, jamming and interference.

It will be apparent to those skilled in the art that various modifications can be made to the frequency agile spread spectrum system of the instant invention without departing from the scope or spirit of the invention, and it is intended that the present invention cover modifications and variations of the frequency agile spread spectrum system provided they come within the scope of the appended claims and their equivalents.

What is claimed is:

1. A method to compensate for frequency error in a receiver, comprising the steps of:

generating, intentionally by the receiver, a frequency in an operating bandwidth of the receiver;

receiving the intentionally generated frequency by the receiver;

correcting frequency error in the receiver by utilizing the intentionally generated frequency received by the receiver; and performing the generating, receiving, and correcting steps with the receiver, wherein the step of receiving includes the substep of sweeping an internal local oscillator of the receiver in order to identify said intentionally generated frequency.

2. A method to compensate for frequency error in a receiver, comprising the steps of:

generating, intentionally by the receiver, a frequency in an operating bandwidth of the receiver;

receiving the intentionally generated frequency by the receiver;

correcting frequency error in the receiver by utilizing the intentionally generated frequency received by the receiver;

performing the generating, receiving, and correcting steps with the receiver; and modulating the intentionally generated frequency in a predetermined manner such that the receiver can uniquely identify the intentionally generated frequency.

3. A method to compensate for frequency error in a receiver, comprising the steps of:

generating, intentionally by the receiver, a frequency in an operating bandwidth of the receiver;

receiving the intentionally generated frequency by the receiver;

correcting frequency error in the receiver by utilizing the intentionally generated frequency received by the receiver; and performing the generating, receiving, and correcting steps with the receiver, wherein said step of receiving comprises the substep of utilizing a fast Fourier transform to receive the intentionally generated frequency.

4. The method according to claim 2, wherein the step of receiving includes the substep of sweeping an internal local oscillator of the receiver in order to identify said intentionally generated frequency.

5. The method according to claim 3, wherein the step of receiving includes the substep of sweeping an internal local oscillator of the receiver in order to identify said intentionally generated frequency.

6. A receiver having an operating bandwidth and an internal local oscillator, comprising:

means for intentionally generating a frequency in the operating bandwidth of the receiver;

means for receiving the intentionally generated frequency, including means for sweeping the internal local oscillator in order to identify said intentionally generated frequency; and means for correcting a frequency error in the receiver by utilizing the received intentionally generated frequency as a reference frequency.

7. A receiver having an operating bandwidth, comprising:

means for intentionally generating a frequency in the operating bandwidth of the receiver;

means for modulating the intentionally generated frequency in a predetermined manner such that the receiver can uniquely identify the intentionally generated frequency;

means for receiving the intentionally generated modulated frequency by the receiver; and means for correcting a frequency error in the receiver by utilizing the intentionally generated modulated frequency as a reference frequency.

8. The receiver according to claim 7, wherein the means for receiving includes means for sweeping an internal local oscillator of the said receiver in order to identify said intentionally generated frequency.

9. A receiver having an operating bandwidth, comprising:

means for intentionally generating a frequency in the operating bandwidth of the receiver;

means for receiving the intentionally generated frequency including a fast Fourier transform mechanism configured to analyze the intentionally generated frequency; and means for correcting a frequency error in the receiver by utilizing the received intentionally generated frequency as a reference frequency.

10. The receiver according to claim 9, wherein the means for receiving includes means for sweeping an internal local oscillator of the said receiver in order to identify said intentionally generated frequency.

* * * * *

UNITED STATES PATENT AND TRADEMARK OFFICE
CERTIFICATE OF CORRECTION

PATENT NO. : 6,335,953 B1  
DATED : January 1, 2002  
INVENTOR(S) : Sanderford, Jr. et al.

It is certified that error appears in the above-identified patent and that said Letters Patent is hereby corrected as shown below:

<u>Title page,</u>  
Item [60], the Related U.S. Application Data should read as follows:

--          Related U.S. Application Data  
[60]     Continuation of application No. 08/931,416, filed on Sep. 16, 1997, now Pat. No. 6,031,883, which is a continuation of application No. 08/311,774, filed on Sep. 23, 1994, now Pat. No. 5,668,828, which is a continuation-in-part of application No. 08/103,993, filed on Aug. 10, 1993, now Pat. No. 5,377,222, which is a division of application No. 07/880,268, filed on May 8, 1992, now Pat No. 5,311,541. --

<u>Column 1,</u>  
Line 3, the first paragraph should read as follows:  
--          CROSS REFERENCE TO RELATED APPLICATIONS This is a continuation of application Ser. No. 08/931,416, filed Sep. 16, 1997, now issued as U.S. Pat. No. 6,031,883, which is a continuation of application Ser. No. 08/311,774, filed on Sep. 23, 1994, now issued as U.S. Pat. No. 5,668,828, which is a continuation-in-part of application Ser. No. 08/103,993, filed on Aug. 10, 1993, now issued as U.S. Pat. No. 5,377,222, which is a division of application Ser. No. 07/880,268, filed on May 8, 1992, now issued as U.S. Pat No. 5,311,541. The benefit of the earlier filing date of the parent patent application is claimed pursuant to 35 U.S.C. § 120. --

Signed and Sealed this

Thirteenth Day of August, 2002

*Attest:*

*Attesting Officer*

JAMES E. ROGAN  
*Director of the United States Patent and Trademark Office*